(12) United States Patent
Zhao et al.

(10) Patent No.: US 10,964,829 B2
(45) Date of Patent: Mar. 30, 2021

(54) INGAN-BASED RESONANT CAVITY ENHANCED DETECTOR CHIP BASED ON POROUS DBR

(71) Applicant: Institute of Semiconductors, Chinese Academy of Sciences, Beijing (CN)

(72) Inventors: Lixia Zhao, Beijing (CN); Lei Liu, Beijing (CN); Chao Yang, Beijing (CN); Jing Li, Beijing (CN); Kaiyou Wang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/500,025

(22) PCT Filed: Jun. 1, 2017

(86) PCT No.: PCT/CN2017/086854
§ 371 (c)(1),
(2) Date: Oct. 1, 2019

(87) PCT Pub. No.: WO2018/184287
PCT Pub. Date: Oct. 11, 2018

(65) Prior Publication Data
US 2020/0035843 A1 Jan. 30, 2020

(30) Foreign Application Priority Data
Apr. 6, 2017 (CN) .......................... 201710220056.1

(51) Int. Cl.
*H01L 31/0232* (2014.01)
*H01L 31/0216* (2014.01)
*H01L 31/0304* (2006.01)

(52) U.S. Cl.
CPC .. *H01L 31/02327* (2013.01); *H01L 31/02161* (2013.01); *H01L 31/03044* (2013.01); *H01L 31/03048* (2013.01)

(58) Field of Classification Search
CPC ......... H01L 31/02327; H01L 31/02161; H01L 31/03044; H01L 31/03048
See application file for complete search history.

(56) References Cited

U.S. PATENT DOCUMENTS

| 6,233,267 B1 * | 5/2001 | Nurmikko | ............ B82Y 20/00 372/46.014 |
|---|---|---|---|
| 2004/0066821 A1 | 4/2004 | Henrichs | |

(Continued)

FOREIGN PATENT DOCUMENTS

| CN | 1748290 A | 3/2006 |
|---|---|---|
| CN | 1799150 A | 7/2006 |

(Continued)

OTHER PUBLICATIONS

PCT/CN2017/086854 International Search Report/Written Opinion dated Jan. 8, 2018, 8 pgs.
Park, S. R. et al. Applications of Electrochemistry for Novel Wide Bandgap GaN Devices ECS Transactions. Dec. 31, 2015 (Dec. 31, 2015), 66(1), p. 143-149.
Chinese Application No. 201710220056.1, First Office Action dated Feb. 24, 2018, with translation, 12 pages.

(Continued)

*Primary Examiner* — Fernando L Toledo
*Assistant Examiner* — Neil R Prasad
(74) *Attorney, Agent, or Firm* — Fish & Richardson P.C.

(57) ABSTRACT

An InGaN-based resonant cavity enhanced detector chip based on porous DBR, including: a substrate (10); a buffer layer (11) formed on the substrate (10); a bottom porous DBR layer (12) formed on the buffer layer (11); an n-type GaN layer (13) formed on the bottom porous DBR layer (12), wherein one side of the n-type GaN layer (13) is recessed downward to form a mesa (13'), and the other side of the n-type GaN layer (13) is protruded; an active region (14) formed on the n-type GaN layer (13); a p-type GaN (Continued)

layer (15) formed on the active region (14); a sidewall passivation layer (20) formed on an upper surface of the p-type GaN layer (15) and sidewalls of the protruded n-type GaN layer (13), the active region (14), and the p-type GaN layer (15), wherein the sidewall passivation layer (20) on the upper surface of the p-type GaN layer (15) has a window in a middle; a transparent conductive layer (16) formed on the sidewall passivation layer (20) and the p-type GaN layer (15) at the window; an n-type electrode (18) formed on the mesa of the n-type GaN layer (13); a p-type electrode (19) formed on a periphery of an upper surface of the sidewall passivation layer (20); a top dielectric DBR layer (17) formed on the transparent conductive layer (16) and the p-type electrode (19).

9 Claims, 2 Drawing Sheets

(56) References Cited

U.S. PATENT DOCUMENTS

| | | |
|---|---|---|
| 2015/0091046 A1 | 4/2015 | Lee |
| 2015/0303655 A1 | 10/2015 | Han et al. |
| 2017/0070026 A1* | 3/2017 | Jogan .................... H01L 31/105 |
| 2017/0194531 A1* | 7/2017 | Huang .................... H01L 33/38 |

FOREIGN PATENT DOCUMENTS

| | | |
|---|---|---|
| TW | 200929758 A | 7/2009 |
| WO | WO2016054232 A1 | 4/2016 |

OTHER PUBLICATIONS

Chinese Application No. 201710220056.1, Fourth Office Action dated Jun. 20, 2019, with translation, 13 pages.

* cited by examiner

INGAN-BASED RESONANT CAVITY ENHANCED DETECTOR CHIP BASED ON POROUS DBR

CROSS-REFERENCE TO RELATED APPLICATIONS

This application is a U.S. National Phase Application of International Application No. PCT/CN2017/086854, filed on Jun. 1, 2017, entitled "INGAN-BASED RESONANT CAVITY ENHANCED DETECTOR CHIP BASED ON POROUS DBR," which claims priority to Chinese Application No. 201710220056.1, filed on Apr. 6, 2017, both of which are incorporated herein by reference in their entirety.

TECHNICAL FIELD

The present disclosure relates to a vertical cavity surface resonant cavity enhanced photo-detector, and more particularly to an InGaN-based vertical cavity surface resonant cavity enhanced detector chip based on a porous Distributed Bragg Reflector (DBR).

BACKGROUND

Currently, visible light communication has broad application prospects in the field of smart homes and smart cities. As an important part of the visible light communication system, the photoelectric conversion efficiency and response speed at the light receiving end will directly restrict the transmission distance and transmission rate of the visible light communication. At present, conventional Si-based or GaAs, GaP-based commercial semiconductor visible light detectors are used in the light receiving end, but such conventional detectors are susceptible to background signal interference in outdoor complex communication environments. GaN and its ternary compounds such as AlGaN and InGaN, have wide and adjustable bandgap. Therefore, GaN-based devices have unique advantages in photoelectric applications of ultraviolet light and visible light. GaN-based materials have excellent thermal and chemical stability and are highly resistant to radiation, thereby enabling the GaN-based optoelectronic devices to operate under extreme conditions. In addition, GaN-based materials also have a high electron drift speed, which facilitates the fabrication of high-frequency photo-detector devices. In particular, in the terms of integration of visible light communication systems, since the InGaN-based visible light detector may have the same material as the light emitting device commonly used in visible light communication, InGaN/GaN quantum well light-emitting diode, it is compatible with the latter in the manufacturing, thus having a pleasant prospect.

However, the InGaN-based visible light detector that has been developed recently still has a large gap with respect to the Si-based visible light detector in performance, which is mainly reflected in the low quantum efficiency. A common method of increasing quantum efficiency is to increase the thickness of the absorption layer. However, for InGaN materials, it is very difficult to obtain a thick InGaN layer by epitaxial growth on GaN. Problems such as phase separation, indium (In) polymerization, high background carrier concentration, and material unevenness in the nanometer level may tend to occur. These problems are more severe in thick InGaN layers with high In composition. A common solution is to fabricate an InGaN/GaN super-lattice structure to relieve stress in each layer and suppress phase separation, thereby increasing the effective thickness of InGaN. However, the effective thickness of the InGaN layer obtained by this method is still limited. In addition, improving the quantum efficiency of the detector by increasing the thickness of the absorption layer may increase the drift time of the photo-generated carriers in the absorption layer, limiting the response speed of the detector.

SUMMARY

The present disclosure is aimed to provide an InGaN-based resonant cavity enhanced detector chip based on porous DBR, which has a bottom mirror for the InGaN-based resonant cavity detector with simple fabrication process, low cost and high repetition rate.

The present disclosure provides an InGaN-based resonant cavity enhanced detector chip based on porous DBR, comprising:
  a substrate;
  a buffer layer formed on an upper surface of the substrate;
  a bottom porous DBR layer formed on an upper surface of the buffer layer;
  an n-type GaN layer formed on an upper surface of the bottom porous DBR layer, wherein one side of the n-type GaN layer is recessed downward to form a mesa having a depth smaller than a thickness of the n-type GaN layer, and the other side of the n-type GaN layer is protruded;
  an active region formed on an upper surface of the n-type GaN layer;
  a p-type GaN layer formed on an upper surface of the active region;
  a sidewall passivation layer made of an insulating medium and formed on an upper surface of the p-type GaN layer and sidewalls of the protruded n-type GaN layer, the active region, and the p-type GaN layer, wherein the sidewall passivation layer is further formed to cover a portion of a surface of the n-type mesa, wherein the sidewall passivation layer on the upper surface of the p-type GaN layer has a window in a middle;
  a transparent conductive layer formed on upper surfaces of the sidewall passivation layer and the p-type GaN layer at the window;
  an n-type electrode formed on the mesa of the n-type GaN layer;
  a p-type electrode formed on a periphery of an upper surface of the sidewall passivation layer and covering a portion of the transparent conductive layer;
  a top dielectric DBR layer formed on upper surfaces of the transparent conductive layer and the p-type electrode.

The beneficial effects of the present disclosure are in that: since it is only required to epitaxially grow GaN layers with alternating light and heavy doping concentrations, the problem of lattice mismatch does not exist, and it is also beneficial to release stress in the epitaxial structure, thereby improving the epitaxial quality of the crystal. Moreover, the epitaxial process is relatively simple and controllable, and also easy to repeat. Furthermore, the bottom mirror is embedded directly inside the chip, which facilitates in practical applications. In addition, the porous DBR is fabricated by performing electrochemical methods on GaN layers with alternating light and heavy doping concentrations. Such a fabrication process is simple and inexpensive. The porous DBR structure can fundamentally break through the technical barrier of high reflectivity bottom mirrors for the InGaN-based cavity detectors.

BRIEF DESCRIPTION OF THE DRAWINGS

To make the objectives, technical solutions, and advantages of the present disclosure clearer, the present disclosure will be further described in detail below in conjunction with the specific embodiments and with reference to the accompanying drawings, wherein.

DETAILED DESCRIPTION

Figure 1:
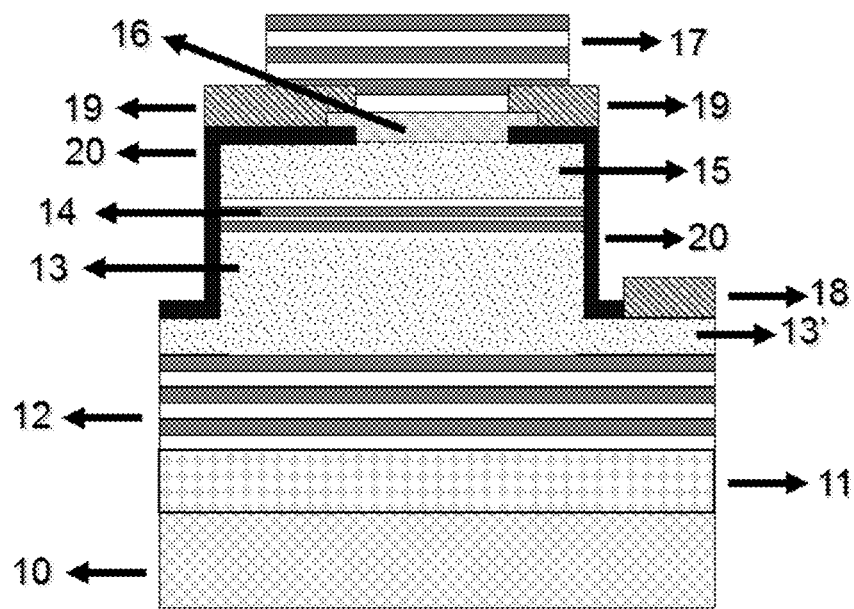
FIG. 1 is a schematic structural view of an InGaN-based resonant cavity enhanced detector chip based on porous DBR according to an embodiment of the present disclosure.

In the present disclosure, the terms "include" and "comprise" and their derivatives are intended to be inclusive and not limiting.

It should be noted that the directional terms mentioned in the present disclosure, such as "upper", "lower", "front", "back", "left", "right", and the like, are only referring to the directions of the drawings, and not used to limit the scope of the present disclosure. The same elements are denoted by the same or similar reference numerals throughout the drawings. Conventional structures or configurations will be omitted when they may cause confusion to the understanding of the present disclosure. The shapes and sizes of the various components in the drawings do not reflect the true size and proportions, but merely illustrate the contents of the embodiments of the present disclosure.

Referring to FIG. 1, the present disclosure provides an InGaN-based resonant cavity enhanced detector chip based on porous DBR. This InGaN-based resonant cavity detector structure comprises:

a substrate 10 which may be a planar sapphire substrate or a patterned sapphire substrate. Other substrates that may be used for epitaxy may include Si, SiC or glass;

a buffer layer 11 formed on the upper surface of the substrate 10. The layer may be formed by growing a GaN nucleation layer at a low temperature, and then growing an unintentionally doped GaN layer at a high temperature, with high-purity pure ammonia gas being used as a nitrogen source and trimethylgallium or triethylgallium being used as a Ga source. Other materials that may be used as a buffer layer may be graphene or zinc oxide;

a bottom porous DBR layer 12 formed on the upper surface of the buffer layer 11. The layer is formed by corroding GaN layers with alternating light and heavy doping concentrations electrochemically, wherein the dopant is silane, the heavy doping concentration is $1 \times 10^{19}$ $cm^{-3}$, and the light doping concentration is $5 \times 10^{16}$ $cm^{-3}$.

an n-type GaN layer 13 formed on the upper surface of the bottom porous DBR layer 12, wherein one side of the n-type GaN layer 13 is recessed downward to form a mesa 13' having a depth smaller than the thickness of the n-type GaN layer 13, and the other side of the n-type GaN layer 13 is protruded. The dopant is silane, and the doping concentration is $1 \times 10^{18}$ $cm^{-3}$. The n-type GaN layer 13 is used as a current spreading layer applied for electrochemical etching to form a porous DBR, and also serves as an electron injecting layer when the device is in operation;

an active region 14 formed on the upper surface of the n-type GaN layer 13. The layer is an InGaN/GaN superlattice layer or a quantum well layer. Other active layers include AlGaN/GaN.

a p-type GaN layer 15 formed on the upper surface of the active layer 14. The dopant of this layer is magnesocene, and the doping concentration is $1 \times 10^{20}$ $cm^{-3}$.

a sidewall passivation layer 20 made of an insulating medium, such as $SiO_2$, and formed on the upper surface of the p-type GaN layer 15 and sidewalls of the protruded n-type GaN layer 13, the active layer 14, and the p-type GaN layer 15, wherein the sidewall passivation layer 20 is further formed to cover a portion of the surface of the n-type mesa 13', wherein the sidewall passivation layer 20 on the upper surface of the p-type GaN layer 15 has a window in the middle. This layer is used for sidewall passivation to reduce the surface recombination current of the device. Other materials that may be used as the sidewall passivation layer include $Si_3N_4$, $HfO_2$ or $Al_2O_3$.

a transparent conductive layer 16 formed on upper surfaces of the sidewall passivation layer 20 and the p-type GaN layer 15 at the window. This layer is an indium-doped tin oxide layer and serves as a transparent electrode to make an ohmic contact with the p-type GaN layer. Other alternative materials for the indium-doped tin oxide layer include metal films, aluminum-doped zinc oxide, graphene or nano-silver wires.

an n-type electrode 18 formed on the mesa 13' of the n-type GaN layer 13. The used metal system is Cr/Al/Ti/Au, and other metal systems that may be used as electrodes include Ni/Au, Cr/Pt/Au, Ni/Ag/Pt/Au, Ti/Au, Ti/Pt/Au.

a p-type electrode 19 formed on the periphery of the upper surface of the sidewall passivation layer 20 and covering a portion of the transparent conductive layer 16. The used metal system is Cr/Al/Ti/Au. Other metal systems that may be used as electrodes include Ni/Au, Cr/Pt/Au, Ni/Ag/Pt/Au, Ti/Au, Ti/Pt/Au.

a top dielectric DBR layer 17 formed on upper surfaces of the transparent conductive layer 16 and the p-type electrode 19. This layer is a $SiO_2/TiO_2$ dielectric layer DBR and serves as a top mirror. Other alternative DBRs include $SiO_2/Ta_2O_5$, $ZrO_2/SiO_2$, $SiO_2/Al_2O_3$ or $TiO_2/Al_2O_3$ dielectric layer DBR. The dielectric layer may include a phase adjustment layer to adjust the electric field distribution in the resonant cavity.

Figure 2:
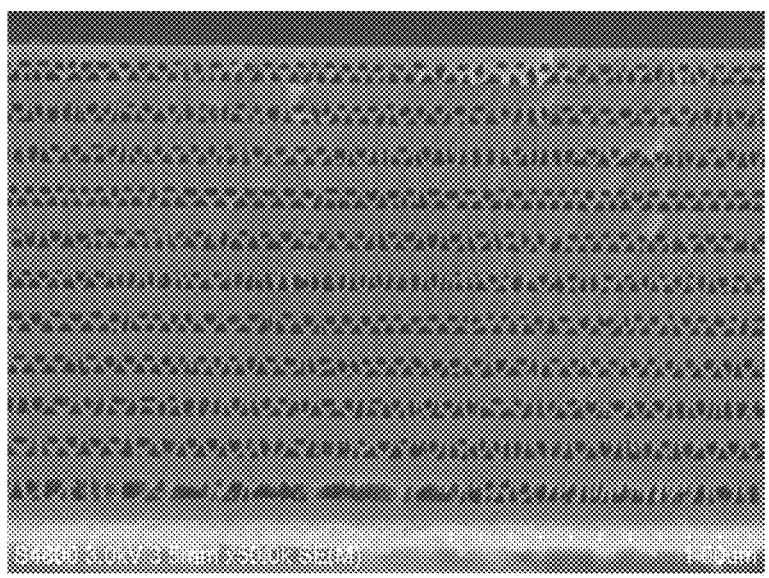
FIG. 2 is a scanning electron microscope (SEM) picture of the porous DBR of FIG. 1 of the present disclosure.
Figure 3:
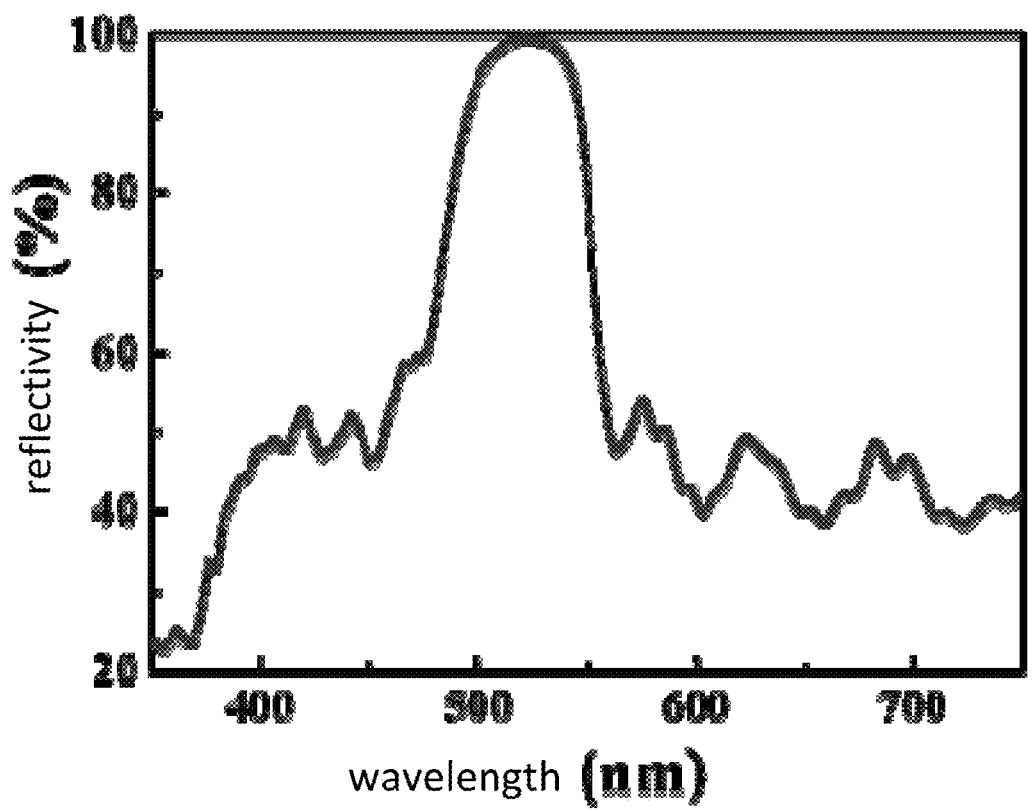
FIG. 3 is a reflection spectrum corresponding to the porous DBR of FIG. 1 of the present disclosure.

FIG. 2 shows a SEM picture of the porous DBR layer 12. The porous GaN layers in FIG. 2 are the heavily doped GaN layers after electrochemical etching, and the uncorroded GaN layers are the unintentionally doped layers. FIG. 3 is the reflection spectrum of this porous DBR, in which the abscissa is the wavelength of light and the ordinate is the reflectivity. As can be seen from the reflection spectrum, the DBR has a very high reflectivity and a wide high reflection band near 520 nm.

According to the embodiment of the present disclosure, by using a resonant cavity structure in the InGaN-based detector, the light waves are enabled to travel back and forth in the resonant cavity to form a photoelectric enhancement effect, so that a higher quantum efficiency is obtained on the InGaN absorption layer with limited thickness, without restricting the response speed of the InGaN-based detector. In addition, the detector with a resonant cavity structure can also achieve selective response of specific wavelengths such as blue light, by utilizing the mode selection in the resonant cavity. This may improve the wavelength recognition capability and anti-interference ability of the detector greatly. By modulating the In composition in InGaN, the response wavelength of the resonant cavity detector can be adjusted, which is beneficial to realize the multiplexed communication of different wavelengths, that is, wavelength division multiplexing, thereby greatly expanding the communication bandwidth.

It should be noted that the above description is only the specific embodiment of the present disclosure, and is not intended to limit the present disclosure. Any modifications, equivalents, improvements, and the like, which are made within the spirit and scope of the present disclosure are intended to be included within the scope of the present disclosure.

We claim:

1. An InGaN-based resonant cavity enhanced detector chip based on porous DBR, comprising:
a substrate;
a buffer layer formed on an upper surface of the substrate;
a bottom porous DBR layer formed on an upper surface of the buffer layer;
an n-type GaN layer formed on an upper surface of the bottom porous DBR layer, wherein one side of the n-type GaN layer is recessed downward to form a mesa having a depth smaller than a thickness of the n-type GaN layer, and the other side of the n-type GaN layer is protruded;
an active region formed on an upper surface of the n-type GaN layer;
a p-type GaN layer formed on an upper surface of the active region;
a sidewall passivation layer made of an insulating medium and formed on an upper surface of the p-type GaN layer and sidewalls of the protruded n-type GaN layer, the active region, and the p-type GaN layer, wherein the sidewall passivation layer is further formed to cover a portion of a surface of the n-type mesa, wherein the sidewall passivation layer on the upper surface of the p-type GaN layer has a window in a middle;
a transparent conductive layer formed on a portion of upper surfaces of the sidewall passivation layer and the p-type GaN layer at the window;
an n-type electrode formed on the mesa of the n-type GaN layer;
a p-type electrode formed on a periphery of an upper surface of the sidewall passivation layer and covering a portion of the transparent conductive layer; and
a top dielectric DBR layer formed on upper surfaces of the transparent conductive layer and the p-type electrode.

2. The InGaN-based resonant cavity enhanced detector chip of claim 1, wherein the top dielectric DBR layer and the bottom porous DBR layer constitute upper and lower mirrors of a resonant cavity respectively, and the bottom porous DBR layer has a reflectivity more than 95% at a peak emission wavelength of the active region, which is higher than the reflectivity of the top dielectric DBR layer.

3. The InGaN-based resonant cavity enhanced detector chip of claim 1, wherein the bottom porous DBR layer is a nitride DBR formed by stacking porous layers and non-porous layers alternately, and comprises n-type heavily doped layers and unintentionally doped layers made of GaN, AlGaN, InGaN or AlInGaN or a combination thereof.

4. The InGaN-based resonant cavity enhanced detector chip of claim 1, wherein the top dielectric DBR layer is a multi-periodic DBR structure formed by stacking oxides having different refractive indices alternately and has a material of $SiO_2/TiO_2$, $SiO_2/Ta_2O_5$, $ZrO_2/SiO_2$, $SiO_2/Al_2O_3$ or $TiO_2/Al_2O_3$.

5. The InGaN-based resonant cavity enhanced detector chip of claim 1, wherein the substrate of the chip is made of sapphire, Si or SiC; the buffer layer comprises a low-temperature GaN nucleation layer and an unintentionally doped GaN layer that are sequentially grown, and the nucleation layer is made of AlN, ZnO or graphene.

6. The InGaN-based resonant cavity enhanced detector chip of claim 1, wherein the active region is a GaN-based multiple quantum well structure under the visible band; and the transparent conductive layer is made of ITO, graphene, ZnO thin film, transparent metal electrode material, or a composite film material composed of above materials.

7. The InGaN-based resonant cavity enhanced detector chip of claim 1, wherein the sidewall passivation layer is made of $SiO_2$, $Si_3N_4$, $HfO_2$ or $Al_2O_3$.

8. The InGaN-based resonant cavity enhanced detector chip of claim 1, wherein an n-type GaN layer is further grown between the bottom porous DBR layer and the buffer layer, and is used as a current spreading layer applied for electrochemical etching to form a porous DBR.

9. The InGaN-based resonant cavity enhanced detector chip of claim 6, wherein the visible band is blue light, green light, yellow light, or purple light.

* * * * *